(12) United States Patent
Cowan

(10) Patent No.: US 6,865,435 B1
(45) Date of Patent: Mar. 8, 2005

(54) METHOD OF TRANSLATING A NET DESCRIPTION OF AN INTEGRATED CIRCUIT DIE

(75) Inventor: Joseph Cowan, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/658,017

(22) Filed: Sep. 8, 2003

(51) Int. Cl.[7] ................................................. G06K 9/00
(52) U.S. Cl. ...................... 700/110; 700/121; 382/145; 716/12
(58) Field of Search ............................. 700/27, 83, 97, 700/98, 108, 110, 121; 382/141, 204, 145–151; 716/12–13

(56) References Cited

U.S. PATENT DOCUMENTS

| | | | | |
|---|---|---|---|---|
| 5,392,222 A | * | 2/1995 | Noble | 716/19 |
| 5,568,563 A | * | 10/1996 | Tanaka et al. | 382/144 |
| 5,572,636 A | * | 11/1996 | Sakuraba et al. | 345/586 |
| 5,731,986 A | * | 3/1998 | Yang | 716/19 |
| 5,751,581 A | * | 5/1998 | Tau et al. | 700/115 |
| 5,985,497 A | * | 11/1999 | Phan et al. | 430/30 |

* cited by examiner

*Primary Examiner*—Leo Picard
*Assistant Examiner*—Sean Shechtman
(74) *Attorney, Agent, or Firm*—Fitch, Even, Tabin & Flannery

(57) ABSTRACT

A method of representing a net includes steps of: (a) receiving as input vertices of a net in an integrated circuit die; (b) calculating rounded coordinates having a selected resolution for each of the vertices; (c) calculating rounded coordinates having the selected resolution along the net between each of the vertices; and (d) generating as output the rounded coordinates to represent the net.

21 Claims, 7 Drawing Sheets

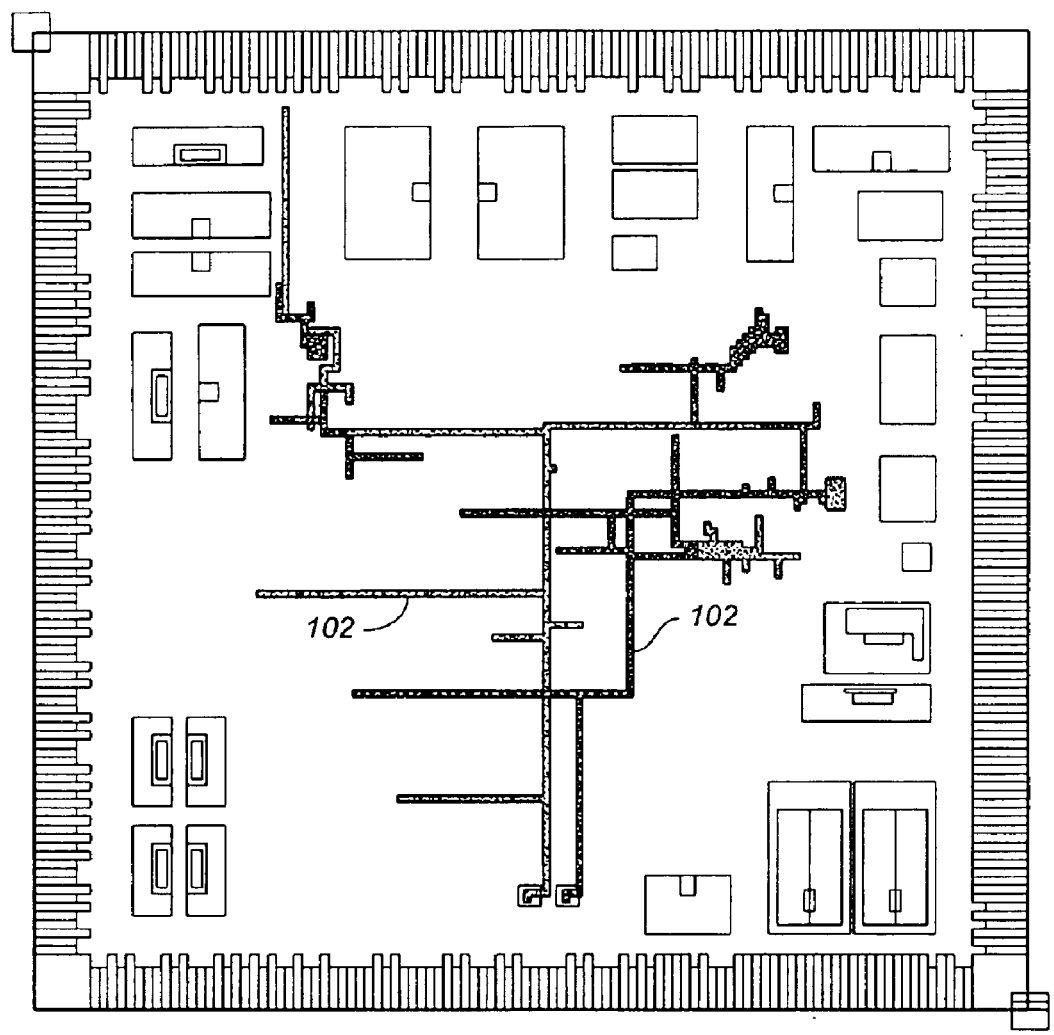
FIG._1
*(PRIOR ART)*

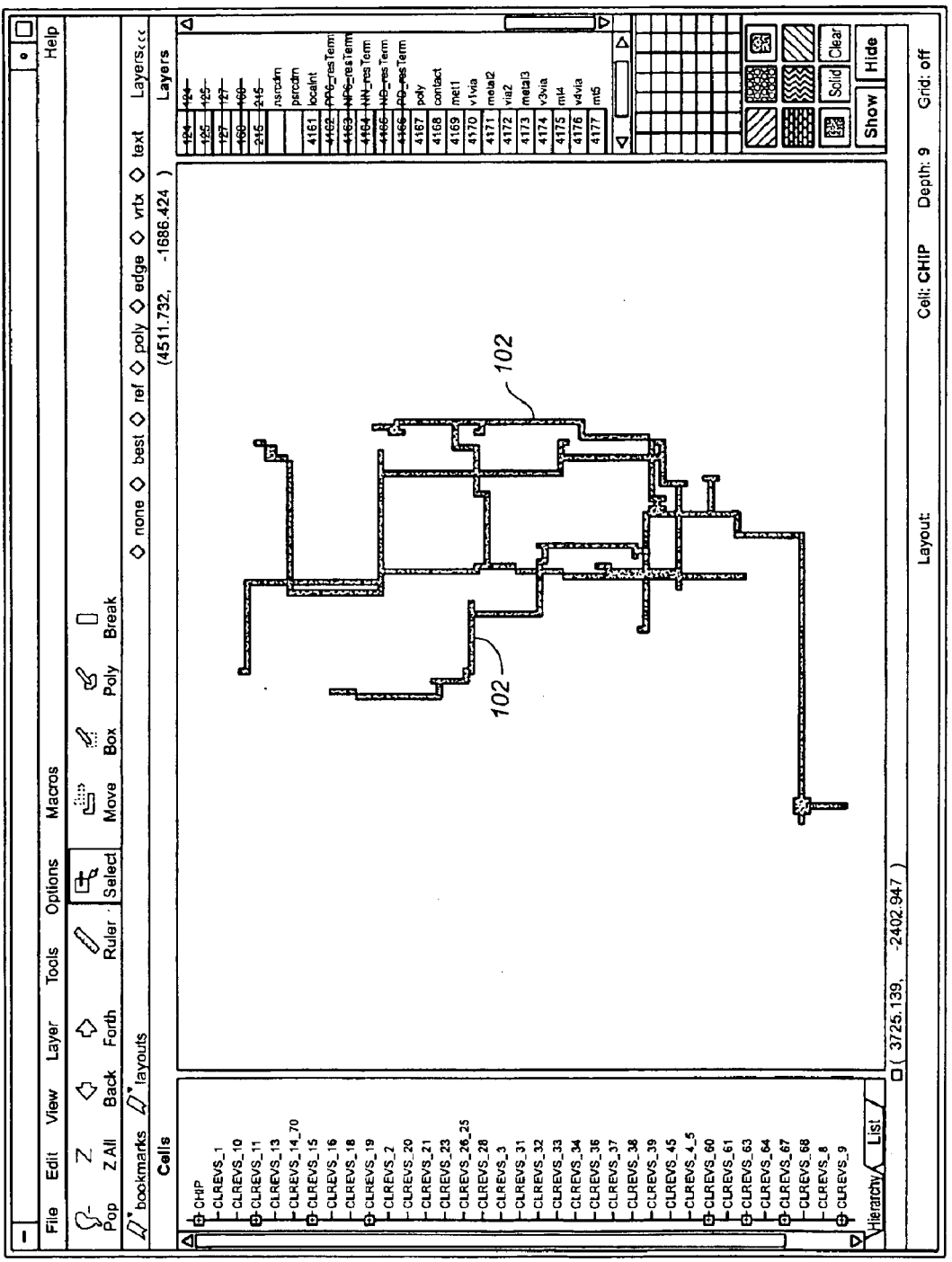
FIG._2 (PRIOR ART)

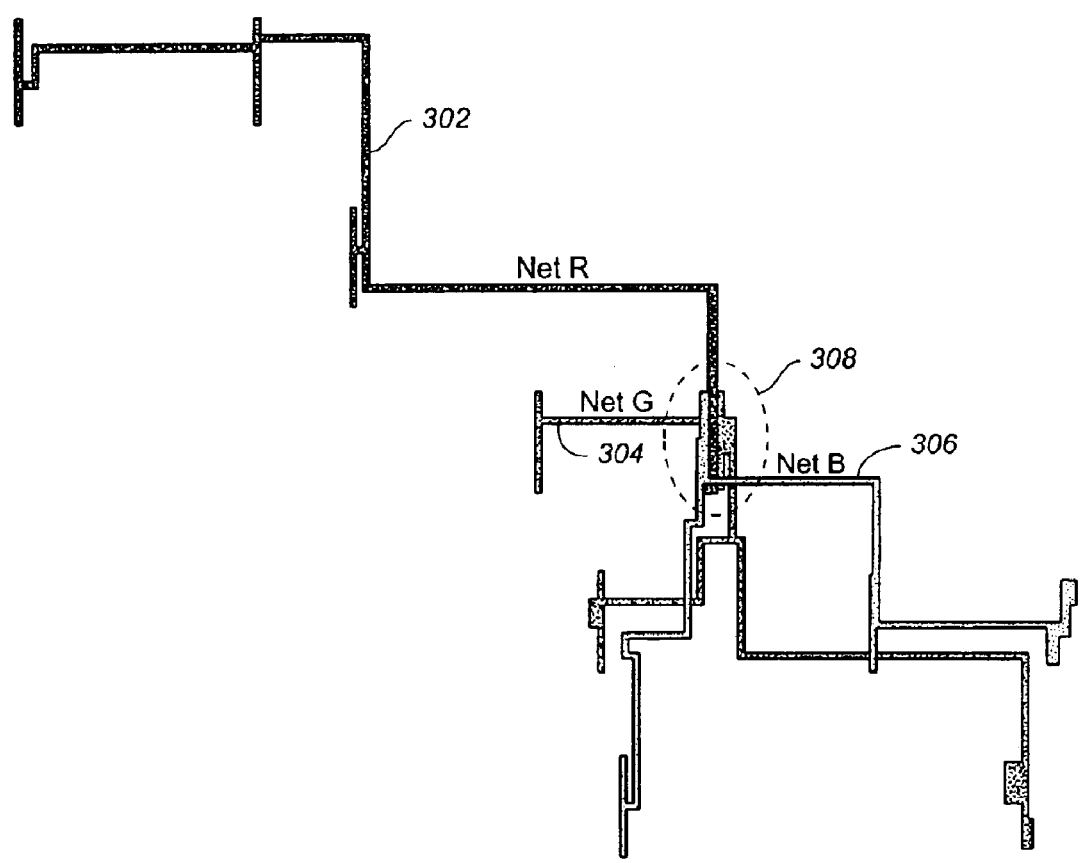
FIG._3
(PRIOR ART)

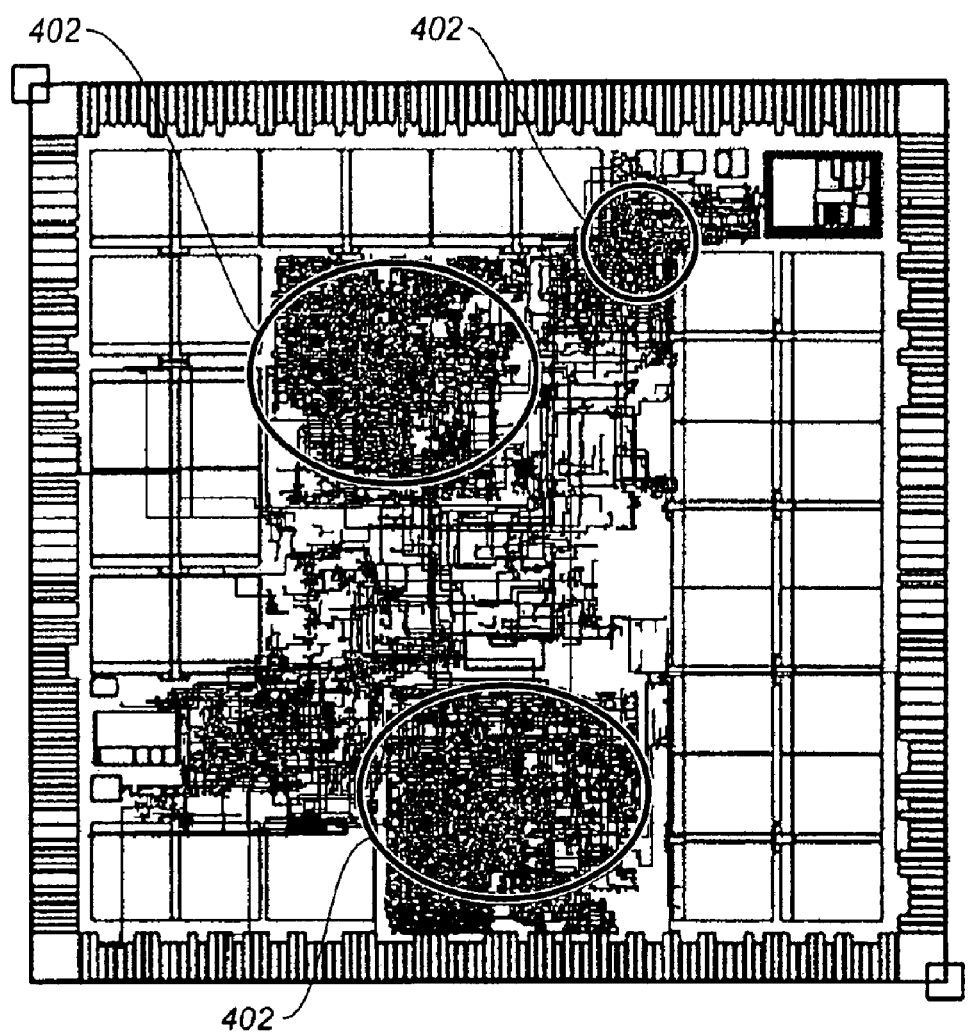
FIG._4

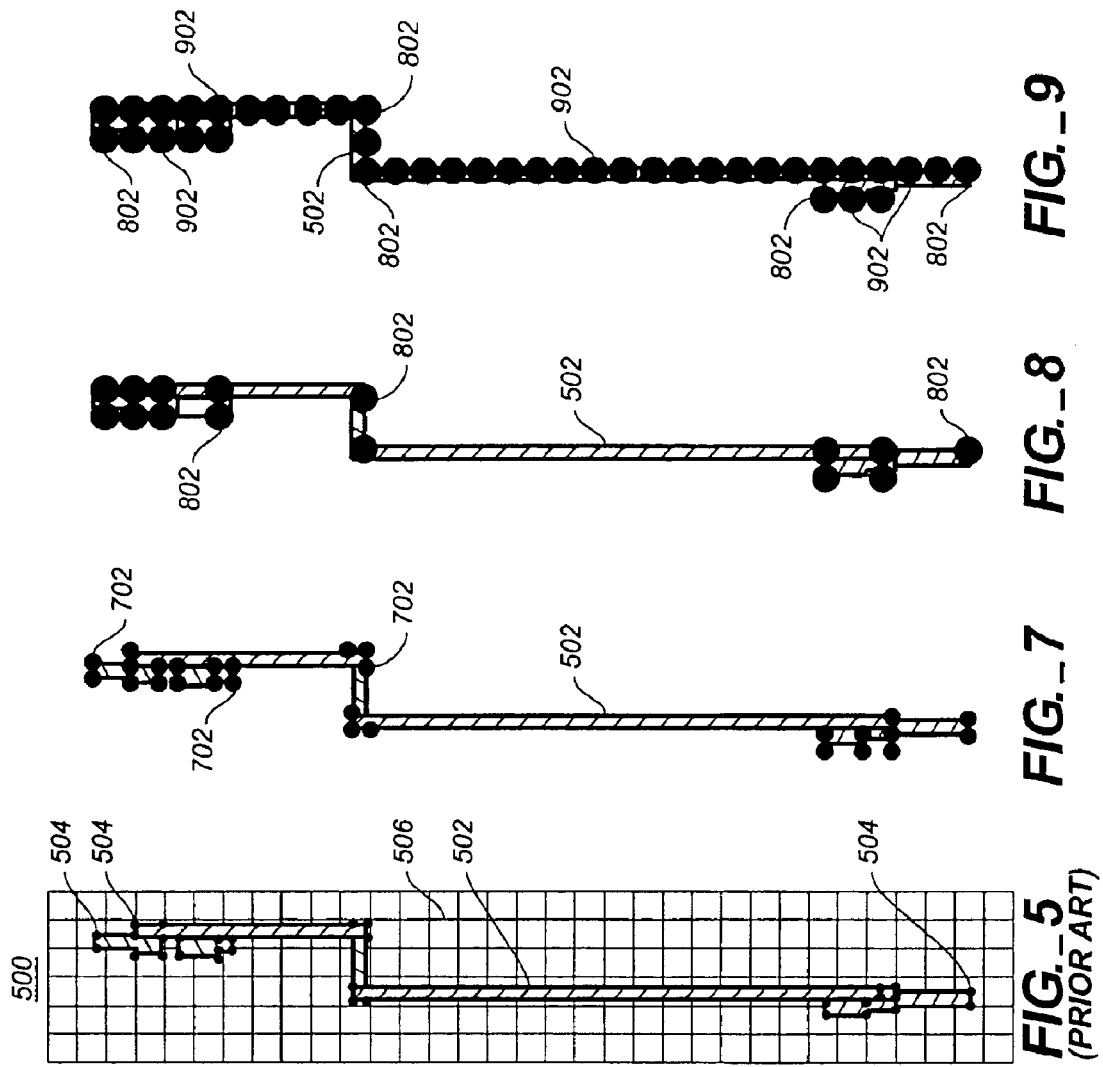

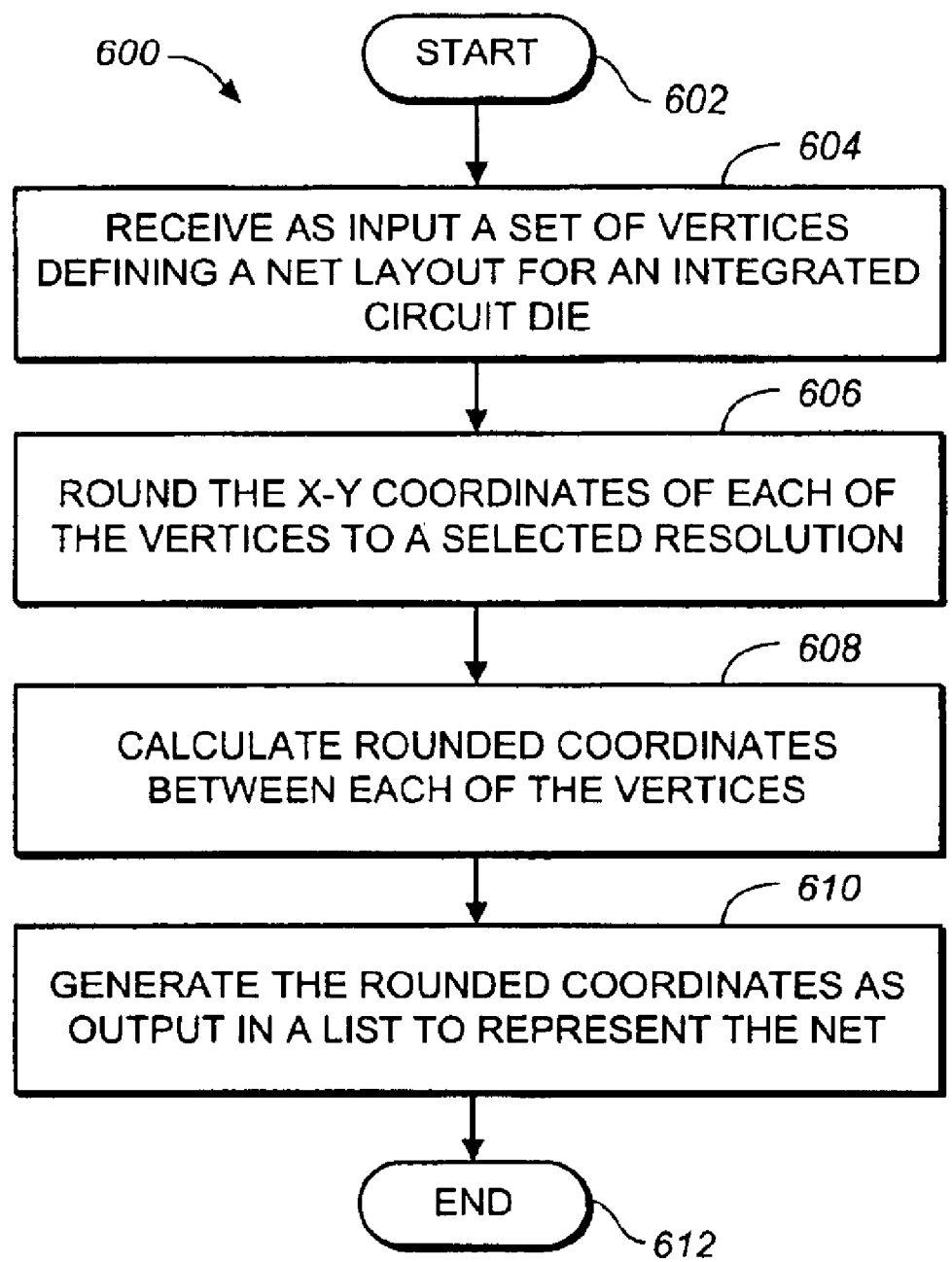
FIG._6

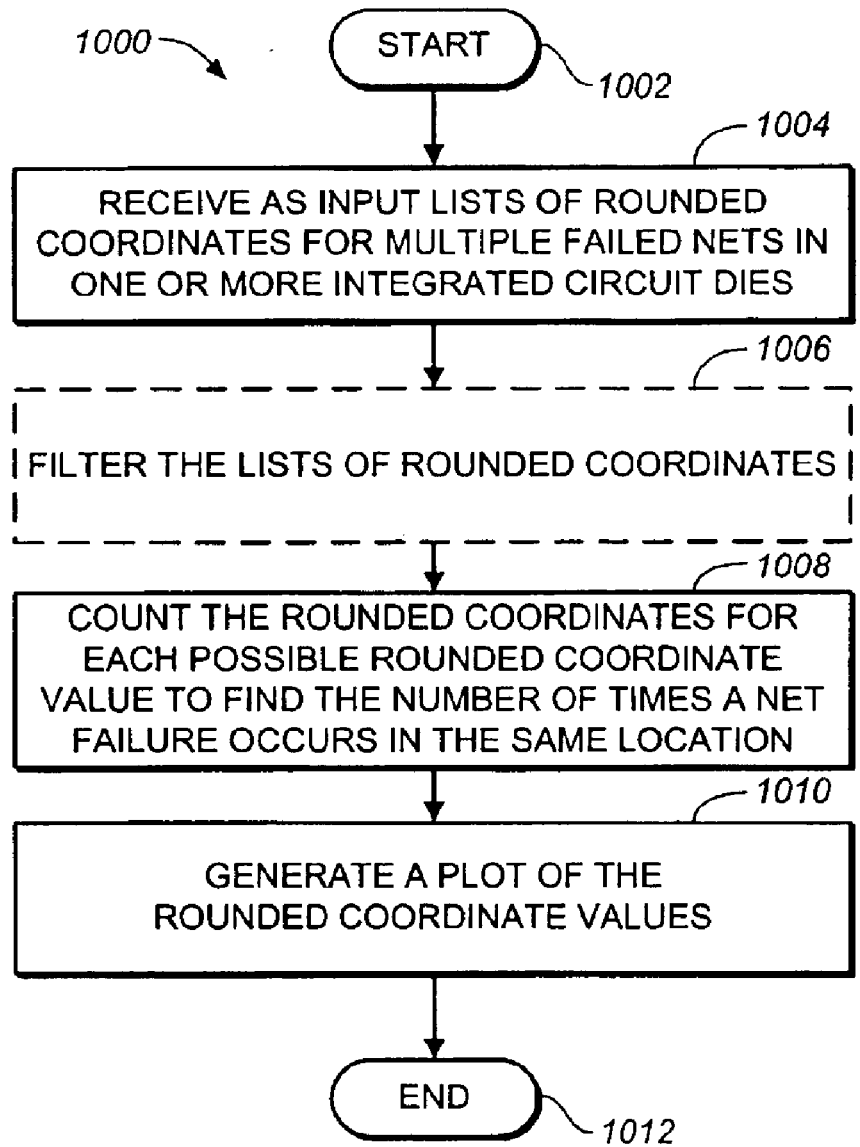
FIG._10

METHOD OF TRANSLATING A NET DESCRIPTION OF AN INTEGRATED CIRCUIT DIE

BACKGROUND OF THE INVENTION

1. Field of the Invention

The present invention relates generally to the testing of integrated circuit dies. More specifically, but without limitation thereto, the present invention relates to locating manufacturing defects in an integrated circuit die by identifying areas of multiple net failures.

2. Description of Related Art

The combination of logic tests for specific logic paths and computer automated design (CAD) navigation tools that can map nets in an integrated circuit die allows the physical path of a failed net in the die to be displayed and plotted after a performance test. The plots from a number of tests performed on different dies for identical test paths may be combined to produce a stacked map for displaying the locations of the highest number of failures to identify physical features on the die that are most likely to be the cause of the failed nets.

SUMMARY OF THE INVENTION

In one aspect of the present invention, a method of representing a net of an integrated circuit die includes steps of:
  (a) receiving as input vertices of a net in an integrated circuit die;
  (b) calculating rounded coordinates having a selected resolution for each of the vertices;
  (c) calculating rounded coordinates having the selected resolution along the net between each of the vertices; and
  (d) generating as output the rounded coordinates to represent the net.

In another aspect of the present invention, a computer program product for representing a net of an integrated circuit die includes:
  a medium for embodying a computer program for input to a computer; and
  a computer program embodied in the medium for causing the computer to perform steps of:
  (a) receiving as input vertices of a net in an integrated circuit die;
  (b) calculating rounded coordinates having a selected resolution for each of the vertices;
  (c) calculating rounded coordinates having the selected resolution along the net between each of the vertices; and
  (d) generating as output the rounded coordinates to represent the net.

In a further aspect of the present invention, a method of representing a net includes steps of:
  (a) receiving as input vertices of a net;
  (b) selecting a resolution for representing spatial features of the net;
  (c) calculating rounded coordinates having the selected resolution for each of the vertices;
  (d) calculating rounded coordinates having the selected resolution along the net between the vertices; and
  (e) generating as output the rounded coordinates to represent the net.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates an example of a computer aided design (CAD) layout of the prior art;

FIG. 2 illustrates a computer display of a higher magnification of the failed nets in the layout of FIG. 1;

FIG. 3 illustrates a computer display of failed nets from different die according to the prior art;

FIG. 4 illustrates a computer aided design (CAD) stacked map of failing nets in multiple dies according to an embodiment of the present invention;

FIG. 5 illustrates a CAD display of a section of a typical net according to the prior art;

FIG. 6 illustrates a flow chart for a method of representing a net of an integrated circuit die according to an embodiment of the present invention;

FIG. 7 illustrates the net section of FIG. 5 after rounding the vertex coordinates according to an embodiment of the present invention;

FIG. 8 illustrates the net section of FIG. 7 after rounding each of the vertex coordinates to a coarser resolution;

FIG. 9 illustrates the net section of FIG. 8 after calculating rounded coordinates between each of the vertices; and FIG. 10 illustrates a flow chart of a method of analyzing multiple failed nets from a database generated according to the method of FIG. 6.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

FIG. 1 illustrates an example of a computer aided design (CAD) layout of the prior art. Shown in FIG. 1 are failed nets 102 from a selected set of tests performed on one die of a production lot of integrated circuit dies.

The graphic representation of failed nets 102 for a specific die illustrated in FIG. 1 constitutes one of a set of group of nets per die for a wafer lot or lots tested that may be combined or stacked to create a failure density plot.

A mathematical description of failed nets, for example, the vertex coordinates of the net segments, may be advantageously reformatted into a pattern of dot coordinates that may readily be manipulated, that is, stacked, to generate a net failure density plot such as the one illustrated in FIG. 1. The density plot may be analyzed and compared to design, test, yield analysis, and failure analysis data by commercial software available from different vendors.

In one aspect of the present invention, a method of representing a net of an integrated circuit die includes steps of:
  (a) receiving as input vertices of a net in an integrated circuit die;
  (b) calculating rounded coordinates having a selected resolution for each of the vertices;
  (c) calculating rounded coordinates having the selected resolution along the net between each of the vertices; and (d) generating as output the rounded coordinates to represent the net.

FIG. 2 illustrates a computer display of a higher magnification of the failed nets 102 in the layout of FIG. 1.

Typically, the layer in which each of the nets 102 is formed is displayed in a different color for each layer. The magnified image shows that a net includes various layer segments. Each layer is represented by a unique color. The floorplan data defines the vertex coordinates of each polygon segment in each net segment in each layer. In accordance with various embodiments of the present invention, the layer information for each net segment may be retained in the reformatting of the vertex coordinates to a dot format, for example, for manipulating the failed net data to generate a stacked image, or density plot, for one or more separate net layers in the integrated circuit design.

FIG. 3 illustrates a computer display of failed nets from different die according to the prior art. Shown in FIG. 3 are failed nets 302, 304, and 306 and a common area 308.

In the example of FIG. 3, the three failed nets 302, 304, and 306 all intersect in the common area 308, indicating that there may be a manufacturing defect occurring at the same location in multiple dies in the common area 308. Identifying areas in which a manufacturing defect may occur advantageously reduces the time required to discover and correct problems in the manufacturing process.

FIG. 4 illustrates a computer aided design (CAD) stacked map 400 of failing nets in multiple dies according to an embodiment of the present invention. Shown in FIG. 4 are high failure density areas 402 in which the highest number of failed nets occur.

The high failure density areas 402 are typically represented in a color that stands out from colors of the less dense areas of failure, similar to the distribution of rainfall or temperature in a weather map.

In typical CAD net maps, each net of an integrated circuit die is defined by a set of vertices, as illustrated in FIG. 5.

FIG. 5 illustrates a CAD display 500 of a section of a typical net in FIG. 4. Shown in FIG. 5 are a net section 502, vertices 504, and a grid 506.

In this example, the net section is routed in multiple die layers, indicated in FIG. 5 by the different hatch patterns. A die layer may be a metal layer, a poly layer, a contact layer, a via layer, a well layer, and so on. Each of the vertices 504 is represented as an X-Y coordinate of the net section 502 inside the grid 506. The X-Y coordinates of the vertices 504 are generally stored in a database for generating the CAD net map. Although useful for generating CAD net maps, the vertex coordinates are in a format that may not be readily accommodated by other software.

FIG. 6 illustrates a flow chart 600 for a method of representing a net of an integrated circuit die according to an embodiment of the present invention.

Step 602 is the entry point of the flow chart 600.

In step 604, a set of vertices defining a net layout for an integrated circuit die is received as input, for example, from a CAD database as described above with reference to FIG. 5.

In step 606, the X-Y coordinates of each of the vertices 504 are rounded to a selected resolution. For example, for a selected resolution of 100 grid units, the vertex coordinates (1342,485) would be rounded to the rounded coordinate (1300,500). Two criteria that may be used to select the resolution are the total number of dots required to represent the failed nets selected for analysis and the desired level of detail.

The total number of dots may be an issue for file manipulation and may be limited by computer resources, for example, storage capacity, CPU speed available to calculate the dots, and software limitations on the size of the input data file.

The level of detail is determined by the magnification of the net failure density plot. For example, a low resolution may be used to generate a density plot similar to that of FIG. 4, then the dots may be recalculated in a smaller area with a finer resolution to generate a net failure plot similar to that of FIG. 2. This approach may be advantageous if computer resources are limited, however, a finer resolution is generally preferable. By way of example, the finest resolution may be half the width of the narrowest trace in the net segment as shown in FIG. 7 so that the net segment is completely defined in all applications.

FIG. 7 illustrates the net section of FIG. 5 after rounding each of the vertex coordinates according to an embodiment of the present invention. Shown in FIG. 7 are a net section 502 and rounded coordinates 702.

In FIG. 7, each of the vertex coordinates 504 in FIG. 5 is translated into a rounded coordinate 702. The rounded coordinates 702 are shown as enlarged dots to indicate that the corresponding vertex coordinate 504 is within a radius corresponding to the selected resolution from the rounded coordinate 702. For example, the vertex coordinate (1342, 485) may be translated to the rounded coordinate (1300,500) with a selected resolution of 100. The vertex coordinate (1342,485) is located within a radius corresponding to the selected resolution of 100 around the point (1300,500). In the same manner, the vertex coordinates for each net in the CAD representation may be translated into rounded coordinates.

Depending on the values of the vertex coordinates and the selected resolution, it is possible that two closely spaced vertices may be rounded or mapped to the same dot. Consequently, there may be a lower number of dots that have to be stored and processed, and the reduced number of dots may not all be equidistant from the original vertex coordinates.

FIG. 8 illustrates the net section of FIG. 7 after rounding each of the vertex coordinates to a coarser resolution. Shown in FIG. 8 are a net section 502 and rounded coordinates 802.

As the resolution of the rounded coordinates is decreased, the dot size of the rounded coordinates 802 increases, and may include neighboring vertices in the net section 502. For example, at a resolution of 50 grid units, the vertices (1342, 485) and (1364, 485) may both be represented by a single dot having a radius of 50 grid units at (1350, 500).

In step 608, rounded coordinates are calculated between each of the vertices as shown in FIG. 9.

FIG. 9 illustrates the net section of FIG. 8 after calculating rounded coordinates between each of the vertices. Shown in FIG. 9 are a net section 502 and rounded coordinates 802 and 902.

After calculating the rounded coordinates 802 for the vertices, each net segment is filled in to cover the entire length of the net so that every vertex in the net is connected by the rounded coordinates 902. The coarser the resolution selected to calculate the rounded coordinates 802 and 902, the fewer rounded coordinates required to describe the net. However, selecting too coarse a resolution may not reveal spatial details of the net structure that could be significant in analyzing causes of failure in the die. The spatial features of the causes of failure being analyzed therefore guide the selection of the dot resolution.

In step 610, the rounded coordinates 802 and 902 are generated as output in a list to represent the net. The rounded coordinates 802 and 902 may also be stored in a database for analysis and display by commercially available software from various vendors.

Step 612 is the exit point of the flow chart 600.

A database of rounded coordinates may be generated according to the method of representing a net of an integrated circuit die described above for each net in multiple dies to assist in identifying causes of net failure as follows.

FIG. 10 illustrates a flow chart 1000 of a method of analyzing multiple failed nets from a database generated according to the method of FIG. 6.

Step 1002 is the entry point of the flow chart 1000.

In step 1004, lists of rounded coordinates for multiple failed nets in one or more integrated circuit dies is received as input.

In step 1006, the lists of rounded coordinates for the multiple failed nets may be filtered according to well-known techniques, for example, to isolate a specific net, a die layer, die area, wafer, and so on to assist in identifying causes of net failure.

In step 1008, the filtered or unfiltered rounded coordinates are counted or stacked for each possible rounded coordinate value to find the number of times a net failure occurs in the same location. For example, if four of the rounded coordinate lists included the rounded coordinate value (1300, 400), then the count corresponding to the rounded coordinate value (1300, 400) would equal four. If two of the rounded coordinate lists included the rounded coordinate value (1400, 400), then the count corresponding to the rounded coordinate value (1400, 400) would equal two, and so on.

In step 1010, a density plot of the rounded coordinate values is generated according to well-known techniques, for example, using color to indicate the count value for each of the rounded coordinates mapped in an X-Y plot, also referred to as a scatter plot or an image plot. A defective area of a die may be revealed in the density plot as a "hot-spot" of color indicating a common area of the die in which a high number of net failures occur. In the same manner, density plots of various parameters of integrated circuit nets may be summed over identical rounded coordinates in multiple nets and plotted as a function of the rounded coordinates to practice various embodiments of the present invention within the scope of the appended claims.

Step 1012 is the exit point of the flow chart 1000.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow charts described above may also be implemented by instructions performed on a computer according to well-known computer programming techniques.

In another aspect of the present invention, a computer program product for mapping logic failures in an integrated circuit die includes:

a medium for embodying a computer program for input to a computer; and a computer program embodied in the medium for causing the computer to perform steps of:

(a) receiving as input vertices of a net in an integrated circuit die;

(b) calculating rounded coordinates having a selected resolution for each of the vertices;

(c) calculating rounded coordinates having the selected resolution along the net between each of the vertices; and (d) generating as output the rounded coordinates to represent the net.

In alternative embodiments of the present invention, other physical features may be manipulated and displayed, for example, a cluster of dense net segments in metal-2 rather than only failed nets. Also, a net as defined in the context of the present invention may be any routing of polygons and is not necessarily limited to integrated circuits. For example, traffic routes used for transportation, networks used for communications, and even anatomical features may be represented and analyzed in accordance with various embodiments of the present invention within the scope of the appended claims.

In a further aspect of the present invention, a method of representing a net includes steps of:

(a) receiving as input vertices of a net;

(b) selecting a resolution for representing spatial features of the net;

(c) calculating rounded coordinates having the selected resolution for each of the vertices;

(d) calculating rounded coordinates having the selected resolution along the net between the vertices; and (e) generating as output the rounded coordinates to represent the net.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:

(a) receiving as input vertices of each of a plurality of nets in an integrated circuit die;

(b) selecting a resolution from a plurality of resolutions for rounding coordinates of the vertices according to a desired level of detail for a net failure density plot;

(c) calculating the rounded coordinates of the vertices according to the selected resolution for each of the plurality of nets;

(d) calculating rounded coordinates having the selected resolution to fill in each of the plurality of nets between the vertices; and (e) generating as output the rounded coordinates of the vertices and the rounded coordinates between the vertices to represent each of the plurality of nets.

2. The method of claim 1 wherein step (d) comprises incrementing an X-coordinate or a Y-coordinate of each of the rounded coordinates of the vertices by the selected resolution to generate the rounded coordinates between the vertices.

3. The method of claim 2 further comprising a step of translating coordinates of multiple vertices located within a radius corresponding to the selected resolution to the same rounded coordinate.

4. The method of claim 2 further comprising a step of entering the rounded coordinates representing the net into a database including at least one of a wafer lot identification, a wafer identification, a die identification, and a layer identification.

5. The method of claim 1 further comprising a step of finding a defect on the integrated circuit die by associating a rounded coordinate that occurs more than a selected number of times in a plurality of failed nets with a location of the defect.

6. The method of claim 1 further comprising a step of finding a number of times each rounded coordinate occurs in a plurality of failed nets.

7. The method of claim 6 further comprising a step of generating the net failure density plot to display the number of times each rounded coordinate occurs in the plurality of failed nets.

8. The method of claim 7 further comprising a step of associating a color with the number of times each rounded coordinate occurs in the plurality of failed nets.

9. The method of claim 7 further comprising a step of filtering the plurality of failed nets to isolate at least one of a wafer lot, a wafer, a die, an area, and a layer.

10. The method of claim 1 further comprising a step of generating a plot of a value of a net parameter as a function of the rounded coordinates summed over identical rounded coordinates in each of the plurality of nets.

11. A computer program product comprising:
   a medium for embodying a computer program for input to a computer; and
   a computer program embodied in the medium for causing the computer to perform steps of:
   (a) receiving as input vertices of each of a plurality of nets in an integrated circuit die;
   (b) selecting a resolution from a plurality of resolutions for rounding coordinates of the vertices according to a desired level of detail for a net failure density plot of the integrated circuit die;
   (c) calculating the rounded coordinates of the vertices according to the selected resolution for each of the plurality of nets;
   (d) calculating rounded coordinates having the selected resolution to fill in each of the plurality of nets between the vertices; and
   (e) generating as output the rounded coordinates of the vertices and the rounded coordinates between the vertices to represent each of the plurality of nets.

12. The computer program product of claim 11 wherein step (c) comprises incrementing an X-coordinate or a Y-coordinate of each of the rounded coordinates of the vertices by the selected resolution to generate the rounded coordinates between the vertices.

13. The computer program product of claim 11 further comprising a step of translating coordinates of multiple vertices located within a radius corresponding to the selected resolution to the same rounded coordinate.

14. The computer program product of claim 11 further comprising a step of entering the rounded coordinates representing the net into a database including at least one of a wafer lot identification, a wafer identification, a die identification, and a layer identification.

15. The computer program product of claim 11 further comprising a step of finding a defect on the integrated circuit die by associating a rounded coordinate that occurs more than a selected number of times in a plurality of failed nets with a location of the defect.

16. The computer program product of claim 11 further comprising a step of filtering the Plurality of failed nets to isolate at least one of a wafer lot, a wafer, a die, an area, and a layer.

17. The computer program product of claim 11 further comprising a step of finding a number of times each rounded coordinate occurs in a plurality of failed nets.

18. The computer program product of claim 17 further comprising a step of generating the net failure density plot to displaying the number of times each rounded coordinate occurs in the plurality of failed nets.

19. The computer program product of claim 18 further comprising a step of associating a color with the number of times each rounded coordinate occurs in the plurality of failed nets.

20. The computer program product of claim 11 further comprising a step of generating a density plot of a net parameter as a function of the rounded coordinates summed over identical rounded coordinates in multiple nets.

21. The computer program product of claim 11 wherein the net failure density plot includes color for revealing a defective area of the integrated circuit die in which multiple net failures occur.

* * * * *